United States Patent [19]

Grunwald et al.

[11] Patent Number: 4,762,768

[45] Date of Patent: Aug. 9, 1988

[54] THERMALLY STABILIZED PHOTORESIST IMAGES

[75] Inventors: John J. Grunwald, New Haven; Allen C. Spencer, Naugatuck, both of Conn.

[73] Assignee: MacDermid, Incorporated, Waterbury, Conn.

[21] Appl. No.: 879,385

[22] Filed: Jun. 27, 1986

Related U.S. Application Data

[63] Continuation-in-part of Ser. No. 823,942, Jan. 29, 1986, abandoned, which is a continuation-in-part of Ser. No. 802,514, Nov. 27, 1985, Pat. No. 4,701,390.

[51] Int. Cl.$^4$ .............................................. G03C 5/00
[52] U.S. Cl. .................................... 430/324; 430/326; 430/330; 430/325
[58] Field of Search .............. 430/325, 326, 328, 330, 430/331, 324

[56] References Cited

U.S. PATENT DOCUMENTS

| | | | |
|---|---|---|---|
| 2,992,919 | 7/1961 | Beeler et al. | 430/23 |
| 3,459,128 | 8/1969 | Erdmann et al. | 101/466 |
| 4,125,650 | 11/1978 | Chiu et al. | 427/337 |
| 4,690,838 | 9/1987 | Hiraoka et al. | 427/343 |
| 4,701,390 | 10/1987 | Grunwald et al. | 430/325 |

*Primary Examiner*—John Kittle
*Assistant Examiner*—José G. Dees
*Attorney, Agent, or Firm*—St. Onge Steward Johnston & Reens

[57] ABSTRACT

Photo resist image layers, particularly those used for high resolution geometries in microelectronic applications, are stabilized against distortion or degradation by the heat generated during subsequent etching, ion implantation processes and the like, by the application of a film of a thermally stabilizing agent prior to post-development bake of the image layer. High temperature resistant film forming polymers, of which gelatin and gelatin hydrolysates are preferred examples, are employed as thermally stabilizing agents.

The process serves to achieve thermal stabilization of the photoresist image layer without significantly affecting the ease of subsequent stripping of the layer. It is particularly effective when used to thermally stabilize positive resist images derived from photoresist systems based on novolak resins.

16 Claims, No Drawings

THERMALLY STABILIZED PHOTORESIST IMAGES

REFERENCE TO RELATED APPLICATIONS

This application is a continuation-in-part of application Ser. No. 823,942, filed Jan. 29, 1986, abandoned, which in turn is a continuation-in-part of application Ser. No. 802,514 filed Nov. 27, 1985, now U.S. Pat. No. 4,701,390.

BACKGROUND OF THE INVENTION

1. Field of the Invention

This invention relates to an improved process for thermally stabilizing photoresist images and is more particularly concerned with the thermal stabilization of photoresist images having high resolution geometries for use in microelectronic applications.

2. Description of the Prior Art

As technology in the semi-conductor industry advances there is an increasing need for photoresist systems which can provide high resolution images having lines which are often below 1 micron in width. Positive resist systems are gaining popularity for producing such images. Typical of such systems are those based on novolak resins, used in a solvent base with a photosensitizer such as an ester of 1-oxo-2-diazo-naphthoquinone-5-sulfonic acid. The photoresist system of this type is coated on an appropriate substrate such as a silicon wafer whose surface has been treated to form oxides, metals, nitrides, phosphides and the like. The coated substrate is covered with a mask, exposed through the mask using appropriate UV radiation (often monochromatic) and then developed using an alkaline developer. The image present on the mask is thereby reproduced on the substrate, the areas of the photoresist layer, which were exposed to radiation by passage through the transparent portions of the mask, having been rendered soluble in the alkaline developer and therefore having been removed during the developing step. The unexposed portions of the photoresist layer, corresponding to the opaque portions of the mask, remain on the substrate. The developed image layer and substrate is then exposed to a post-development bake, to cure the photoresist remaining on the substrate and enhance the adhesion thereof to the substrate, before subjecting the image and substrate to the pattern generation step. The thermal curing of the photoresist may also take place if the photoresist and substrate are subjected to a later step involving exposure to heat and, in such circumstances, a specific post-development bake may not be required. The pattern generation step comprises etching, ion implantation doping, metal deposition and the like to produce the final desired image (e.g. an integrated circuit) on the substrate. Thereafter, in a final step, the remaining photoresist is stripped from the substrate using appropriate solvents or other techniques known in the art.

A number of problems arise when applying such techniques to the production of high resolution images. The harsh environment, usually including elevated temperatures, created in the etching, ion implantation and like techniques employed in the pattern generation step of the process frequently causes the photoresist image to lose its integrity either by softening and flowing, edge rounding, charring, cracking and the like. This loss of integrity is reflected in loss of the desired features in the final product of the process. Further, in order to prevent attack on the photoresist leading to failure of the latter and thus attack on the underlying substrate in places which the photoresist was designed to protect, it is frequently the practice to employ thicknesses of photoresist layer which are high in relation to the line widths in the image. Ratios of photoresist thickness to line widths as high as 2:1 have been employed. This is commonly referred to in the art as the use of a high aspect ratio image. As will be apparent to one skilled in the art, the use of such high aspect ratios is often difficult to achieve especially when geometries shrink below 1 micron.

It is accordingly desirable to be able to produce high resolution photoresist images which are also capable of surviving exposure to the high temperatures involved in the post-imaging processes without losing their integrity. A number of attempts to achieve such photoresist images have been reported. Illustratively, Ma U.S. Pat. No. 4,187,331 teaches the heat stabilization of a resist image layer by subjecting the latter to an electrodeless flow discharge under low pressure in an atmosphere containing an organic fluorine compound such as carbon tetrafluoride.

Verelst et al. U.S. Pat. No. 3,652,274 describes the preparation of a metal printing plate in which a photoresist image is produced on the metal substrate and the image is developed using a hydrophobizing agent in the development fluid in order to increase the resistance of the image to the etching fluid used in the subsequent step. The hydrophobizing agent can be a fluoroalkyl-substituted organic silane.

Tada et al. U.S. Pat. No. 4,454,222 teaches the preparation of high resolution photoresist images using as the photoresist resin a polymer derived from trifluoroethyl-2-chloroacrylate and employing certain ketones as developers for the exposed image.

Matthews U.S. Pat. No. 4,548,688 describes hardening the photoresist by exposure to UV radiation. This method can cause difficulty in subsequent stripping of the photoresist, as well as introducing an additional equipment handling step in the overall process of producing the final product.

Chiu et al. U.S. Pat. No. 4,125,650 describes hardening photoresist images by chemically bonding a layer of a quinone-diazide hardening agent to the image. Cratering of the unexposed photoresist in positive photoresist images is said to occur due to gas evolved by the diazo compound during the baking step of the process. The coated image is also rendered more difficult to remove from the substrate after pattern generation has been completed.

It has now been found that high resolution photoresist images which are stabilized against distortion and other forms of thermal degradation during post-imaging treatments of the imaged substrate, can be produced by a novel process which will be described hereinafter.

SUMMARY OF THE INVENTION

It is an object of the invention to provide high resolution photoresist images which will withstand exposure to elevated temperatures up to about 220° C. during post-imaging processes without suffering significant distortion or other deterioration of the image profile.

It is a further object of the invention to provide a simple, relatively inexpensive, process for treating a high resolution photoresist image after development and preferably prior to post-development bake whereby the image is stabilized against distortion or other forms of degradation in subsequent post-imaging processes.

It is yet another object of the invention to provide a process for thermally stabilizing a high resolution photoresist image on a substrate without significantly affecting the ease of subsequently stripping said photoresist from the substrate.

Another object of the invention is to dye the photoresist after exposure and development to make it visible for inspection purposes. The resist layer is so thin, typically less than 2 microns, that its inherent color is attenuated below visible recognition.

These objects, and other objects which will become apparent from the description which follows, are achieved by the process of the invention which, in its broadest aspect, comprises a process for thermally stabilizing a photoresist image layer formed on a substrate wherein the image layer, prior to being subjected to a post-development bake, is coated with a protective film of a material which, as discussed in detail below, bonds to the photoresist but is substantially rinsed from the exposed substrate after post bake and which does not interfere with the desired operation of any of the subsequent steps of pattern generation including final removal of the photoresist image. Optionally the protective film also contains a dyestuff.

The process of the invention can be utilized to thermally stabilize any type of photoresist image supported by a substrate. It is particularly advantageous when utilized to treat high resolution positive photoresist images supported on substrates such as silicon, silicon oxide, metals, nitrides, phosphides and the like. In a particularly preferred embodiment of the process of the invention the latter is employed to thermally stabilize a high resolution positive photoresist image which has been prepared using a photoresist system based on a novolak resin.

The invention also comprises high resolution photoresist images supported on substrates, which images have been stabilized against distortion and other degradation which would otherwise be caused by the image during post-development processing of the substrate.

DETAILED DESCRIPTION OF THE INVENTION

As set forth above, the process of the invention can be employed to thermally stabilize any photoresist image formed on a substrate. The formation of the image on the substrate can be carried out by any of the procedures well known and conventionally used in the art. Similarly, the steps to which the image and supporting substrate are subjected, before and after the process of the invention has been carried out on the image, can be any of those well-known and practiced in the art. Illustrative of the steps involved in the preparation of a high (often sub-micron) resolution positive resist image, and its processing by plasma etching to produce geometries which can be sub-micron on silicon wafers and like substrates, are those described by Grunwald et al. in a paper presented at the SPIE Conference on Microlithography, Santa Clara, Calif., March 1984.

The process of the invention is interposed as a novel step in these known and conventionally used processes after the photoresist image has been developed on the substrate but preferably prior to the post-development baking step or prior to exposure to heat generated in the subsequent pattern generation step as discussed above. The novel process step of the invention comprises applying a coating of a protective film of thermally stabilizing material to the surface of the photoresist image.

The thermally stabilizing material can be any of a wide variety of high temperature resistant film forming polymers which meet certain parameters. Thus the material is capable of being applied in solution or as a dispersion in an appropriate medium (preferably water) to form a thin film by coating using spin coating and the like techniques conventionally employed in the art. Secondly, the material bonds sufficiently to the surface of the photoresist image during the heating process so that, after post baking, excess material can be rinsed using appropriate solvents (preferably water) from other portions of the coated substrate without removing any significant amount of the material on the photoresist image. Thirdly, the material is such that it does not interfere with any of the subsequent steps, i.e. the steps of pattern generation and photoresist removal to which the treated image is to be subjected. Finally the material when applied as a coating to the photoresist image serves to stabilize the latter to exposure to temperatures of at least about 140° C. and preferably to temperatures at least as high as about 175° C. Illustrative of film forming polymers which meet the above criteria are carboxymethyl cellulose, carboxyethyl cellulose, polyvinyl alcohol, polyvinylpyrrolidone, polyalkylene oxides such as polyethylene oxide, polypropylene oxide and the like, hydrolyzed collagen, and other gelatinous colloidal materials such as pectin, gum tragacanth, gum arabic and the like. The term "hydrolyzed collagen" is inclusive of gelatin and glue derived from sources of collagen such as animal tissue, bones, sinews, hides and the like by hydrolysis (acid or alkaline) or by enzymolysis, as well as further hydrolyzed versions of gelatin and glue. Gelatin and glue are very similar chemically but gelatin is the name given to the proteinaceous product obtained in a purity suitable for edible consumption while glue is the name given to the product obtained in a purity suitable only for non-food uses.

A preferred film forming polymer for use in the present invention is gelatin. Any of the various grades of gelatin including Type A (acid) and Type B (alkali) can be employed. Advantageously the bloom is typically within the range of about 100 to about 275 but the particular bloom is not critical. Indeed, especially preferred film formers for use in the process of this invention are non-gelling hydrolysates of gelatin, such as those obtained from acid or alkaline hydrolysis of Type A or Type B gelatins, particularly those having molecular weights in the 1000 to 5000 range.

Advantageously the thermally stabilizing film-forming polymeric material is employed as a solution in water or in water-miscible solvents such as ethanol, isopropanol, and the like lower aliphatic alcohols, and is applied by any appropriate coating technique such as dip-coating, roller coating, spray coating, spin coating and the like. Spin-coating is a particularly preferred technique in the processing of wafers.

The application of the solution of the above material is carried out advantageously at ambient temperature but elevated temperatures, i.e. temperatures up to about 120° C., can be employed if desired, provided such temperatures have no adverse effect on the photoresist. The concentration of the thermally stabilizing material employed in the coating solution can vary over a wide range from about 0.1 about 10 percent by weight. Preferably the material is employed in a concentration of about 0.5 to about 5 percent by weight and, most preferably, in a range of about 1 to about 2 percent by weight.

The amount of thermally stabilizing material which is applied to the surface of the photoresist image in the above manner is not critical provided that the added film thickness is not so large as to alter significantly the geometry and profile of the image being coated. The spin-coating method of application is particularly advantageous because it leaves only a thin film on the image and any excess is spun-off.

After the coating has been applied in the above manner the coated image and supporting substrate is then subjected to the post-development bake normally employed in the conventional processes of the art discussed above. This bake step is advantageously carried out at a temperature in the range of about 100° C. to about 190° C. or higher provided that the particular temperature chosen in any given instance is such that no significant change of profile or critical dimensions (CDs) of the photoresist image is produced during the baking step. The time for which the baking is continued is not critical and is generally of the order of about 10 minutes to about 30 minutes. The time of baking employed in any given instance is dependent on the bake temperature employed and on the nature of the particular photoresist and protective coating employed. The most appropriate baking time for any given combination of reactants and bake temperatures can be readily determined by a process of trial and error. The baking step is accomplished using equipment such as a convention oven conventionally employed in the art for this particular operation.

After the baking step, the image and substrate are rinsed using water or appropriate water-miscible solvents, to remove material from areas other than the photoresist image but leaving the photoimage itself coated with a protective layer of the material.

The solutions of film-forming polymeric thermally stabilizing agents employed to treat the photoresist in the above-described manner can, if desired, contain additives such as surfactants, dyestuffs, stabilizers and the like provided that these additives do not in any way interfere with the desired result of thermally stabilizing the photoresist or affect the subsequent performance of the photoresist. The inclusion of surfactants serves to lower the surface tension of the aqueous solution of film-forming polymeric material and improve the wettability of the surface of the photoresist which is normally hydrophobic.

Surfactants which can be employed, advantageously in a concentration of about 0.05 to about 3 weight percent, include anionic, cationic and non-ionic surfactants. A preferred group of surfactants are the perflurocarbons and phosphate esters.

Illustrative of the perfluorocarbon surfactants are those which are available from E. I. duPont under the trademark ZONYL and those available from 3M Company under the trademark FLUORAD. Illustrative of phosphate ester surfactants are ethoxylated alcohol phosphate esters available from Jordan Chemical Company.

Any of the dyestuffs known in the art which are compatible with the solution of the thermally stable coating material, and which do not interfere with the thermally stabilizing action of the material or with the subsequent performance of the photoresist, can be employed. Illustrative of such dyestuffs are those of the xanthene type. The presence of the dyestuff in the coating composition and hence in the protective film deposited on the photoresist image greatly facilitates visual inspection of the image.

The amount of dye, i.e. the concentration in parts by weight, which it is necessary to incorporate into the photoresist in order to facilitate inspection of the coated image after application of the solution containing the dye, will obviously vary depending upon the particular dye in question. In general, it has been found that the minimum amount of dye necessary in any given case is that which will produce an optical density in the solution of film forming polymer of not less than about $10^3$. Optical density (E) is defined by the equation $E = \log (I_o/I)$ wherein $I_o$ is the intensity of the incident light and $I$ is the intensity of transmitted (or reflected) light [see for example, Venkataraman, The Chemistry of Synthetic Dyes, Vol. I, p. 310, Academic Press, New York, 1952]. When expressed in terms of proportion by weight in the composition used in the coating, the amount of dye necessary to achieve optical densities of the above order can vary from as little as 0.01 percent by weight to as much as 1 percent by weight or higher depending upon the particular dye under consideration.

The process of the invention serves to impart, to the photoresist image which has been treated, the capability of resisting flow when exposed to temperatures as high as about 220° C. Accordingly, the image so treated is capable of withstanding the temperatures to which it is to be subjected in further processing of the substrate and image supported thereon whether this be by chemical etching or plasma etching and the like, with no unacceptable loss of integrity of the resist image profile. Further, the process of the invention does not interfere with the ease with which the photoresist can be stripped from the substrate when the final step of the overall process is reached. The process of the invention is readily carried out in standard equipment, which same equipment is used in other steps of the overall process of forming and end-processing the photoresist image on the substrate.

While the process of the invention can be used to thermally stabilize any photoresist image supported on a substrate, it is of particular advantage when utilized in the production and processing of high resolution images required in the production of sub-micron circuitry and the like. The process of the invention will be further illustrated below by reference to its use in treating positive photoresist images but it is to be clearly understood that it is not limited to treatment of such images and can be employed with any photoresist images.

The following examples illustrate the process of the invention and the best mode known to the inventors of carrying out the same but are not to be construed as limiting.

EXAMPLE 1

A silicon wafer with approximately 10,000 Angstroms of aluminum over 1,000 Angstroms of silicon dioxide was spun-coated at 5000 rpm with a high resolution, high contrast, high aspect ratio positive photoresist system comprising a solvent blend solution of a novolak resin and a trihydroxybenzophenone ester of 2-diazo-1-oxonaphthoquinone-5-sulfonic acid [ULTRAMAC TM PR 914; MacDermid Inc., Waterbury, Conn.]. The coated wafer was baked at 100° C. for 30 minutes in a convection oven to evaporate the solvents from the coating before being exposed through a submicron geometry mask to UV light in a broad band contact exposure mode using an Oriel printer. The resulting coating had an average thickness of 1.2 microns. The exposed photoresist was developed using an alkaline developer [ULTRAMAC MF-28: MacDermid, Inc.] to give an image of high resolution with walls approaching 90 degrees. The imaged wafer was rinsed with water on the vacuum chuck and flooded with an aqueous solution obtained by dissolving 10 g. of gelatin [granular, 100 bloom: Fisher Scientific Company] in sufficient water, at 50° C., to make 1 liter of solution. The wafer was then spun at 2500 rpm for 20 seconds leaving a thin film of gelatin on the photoresist image. The film dried during the spinning operation. The wafer and image was then baked at 160° C. for 30 minutes in a convection oven and then rinsed with water at about 50° C. After rinsing and drying, the coated wafer was subjected to a plasma treatment under the following conditions:

Plasma Chamber: DRYTEK Model 303
Gas mixture: $BCl_3$ at 302 SCCM, $Cl_2$ at 8 SCCM
Pressure: 124 millitorr
RF Power: 1190 watts
Temperature at wafer: 35° C.
Time: 4 minutes Inspection of the resulting image using a scanning electron microscope showed no significant distortion or other loss of integrity of the walls of the image.

The above procedure was repeated exactly as described except that the step of coating the developed image with gelatin was omitted. It was found that edge rounding of the resulting image was observed when temperatures as low as 120° C. were reached in the final baking step. At higher temperatures than 120° C. more significant distortion was observed.

EXAMPLE 2

The procedure of Example 1 was repeated exactly as described except that a post-bake temperature of 170° C. was employed. Inspection of the photoresist image showed some edge rounding.

EXAMPLE 3

The procedure of Example 1 was repeated exactly as described except that a post-bake temperature of 180° C. was employed. Inspection of the photoresist image after post-bake showed significant edge rounding similar to that observed in the absence of a gelatin coating layer. However, after plasma treatment and resist removal, the lines of the final image were found to be straight, sharp and clean with no evidence of distortion.

EXAMPLE 4

The procedure of Example 1 was repeated exactly as described except that the novolak resin photoresist system there used was replaced by each of the following commercially available novolak-based systems:
PR64 and EPA914 (MacDermid Inc.)

In all cases the resulting photoresist image showed no significant distortion or other loss of integrity.

EXAMPLE 5

The procedure of Example 1 was repeated twice exactly as described except that (a) in one run the aqueous gelatin solution contained 1 percent w/w of gelatin and 0.2 percent w/w of Rhodamine B;
(b) in a second run the aqueous gelatin solution contained 2 percent w/w of gelatin and 0.2 percent w/w of Rhodamine B;
(c) in both runs the baking step was carried out at 170° C. for 30 minutes.

Inspection of the resulting image after plasma treatment in each of the two runs showed no significant distortion or other loss of integrity in the walls of the images.

EXAMPLE 6

The procedure of Example 1 was repeated exactly as described except that 1.5 g. of surfactant [Jordaphos JA-60: Jordan Chemical Company: ethoxylated alcohol phosphate ester] was added to the gelatin solution employed in the coating. After plasma treatment the image was inspected and found to show no significant distortion or other loss of integrity of the walls of the image.

EXAMPLE 7

The procedure of Example 1 is repeated exactly as described except that 2 g. of Rhodamine B and 1.5 g. of surfactant [Jordaphos JA-60] are added to the gelatin solution employed in the coating.

EXAMPLE 8

A silicon wafer with approximately 10,000 Angstroms of aluminum over 1,000 Angstroms of silicon dioxide was spun-coated at 5000 rpm with a high resolution, high contrast, high aspect ratio positive photoresist system comprising a solvent blend solution of novolak resin and a trihydroxybenzophenone ester of 2-diazo-1-oxo-naphthoquinone-5-sulfonic acid [ULTRAMAC TM PR 914; MacDermid, Inc., Waterbury, Conn.]. The coated wafer was baked at 100° C. for 30 minutes in a convection oven to evaporate the solvents from the coating before being exposed through a submicron geometry mask to UV light in a broad band contact exposure mode using an Oriel printer. The resulting coating had an average thickness of 1.2 microns. The exposed photoresist was developed using an alkaline developer [ULTRAMAC MF-28: MacDermid, Inc.] to give an image of high resolution with walls approaching 90 degrees. The imaged wafer was rinsed with water on the vacuum chuck and flooded with an aqueous solution obtained by dissolving 10 g. of nongelling gelatin hydrolysate [hydrolyzed Type B gelatin; molecular weight approximately 2000; protein content above 88%; Peter Cooper Corporations, Oak Creek, Wis. treated to reduce sodium, potassium and iron below 1 ppm] in sufficient water to make 1 liter of solution. The wafer was then spun at 800 rpm for 20 seconds, followed by 4000 rpm for 10 seconds, leaving a thin film of the gelatin hydrolysate on the photoresist image. The film dried during the spinning operation. The wafer and image was then baked at 160° C. for 30 minutes in a convection oven and then rinsed with water for 2 minutes in a rinser-drier. After rinsing and drying, the coated wafer was subjected to a plasma treatment under the following conditions:

Plasma Chamber: DRYTEK Model 303
Gas mixture: $BCl_3$ at 302 SCCM, $Cl_2$ at 8 SCCM
Pressure: 124 millitorr
RF Power: 1190 watts
Temperature at wafer: 35° C.

Time: 4 minutes

Inspection of the resulting image using a scanning electron microscope showed no significant distortion or other loss of integrity of the walls of the image.

What is claimed is:

1. A process for thermally stabilizing a photoresist image layer formed on a substrate against distortion or degradation caused by heat generated in subsequent pattern generation in fabrication of microelectronic circuitry on said substrate which process comprises the steps of coating said image layer with a protective film of a hydrolized collagen and thereafter subjecting said coated image layer to a post-development bake prior to subjecting said image layer and substrate to pattern generation.

2. A process according to claim 1 wherein said hydrolyzed collagen comprises gelatin.

3. A process according to claim 2 wherein said protective film of gelatin is applied to said photoresist image layer in the form of an aqueous solution containing from about 0.1 to about 10 percent by weight of gelatin.

4. A process for thermally stabilizing a photoresist image layer formed on a substrate, said process comprising coating said image layer with a protective film of gelatin by applying said gelatin in an aqueous solution containing about 0.1 to about 10 percent of gelatin which aqueous solution also comprises a dyestuff compatible with gelatin, and thereafter subjecting said coated image layer to a post-development bake.

5. A process according to claim 4 wherein said aqueous solution also comprises a surfactant.

6. A process for thermally stabilizing a photoresist image layer formed on a substrate, said process comprising coating said image with a solution of non-gelling gelatin hydrolysate prior to subjecting said image layer to a post-development bake.

7. A process according to claim 6 wherein said gelatin hydrolysate solution also comprises a surfactant.

8. A process according to claim 7 wherein said surfactant is a phosphate ester.

9. A process according to claim 6 wherein said gelatin hydrolysate solution also comprises a dyestuff compatible with said gelatin.

10. A process according to claim 7 wherein said gelatin hydrolysate solution also comprises a dyestuff compatible with said gelatin.

11. A process according to claim 8 wherein said gelatin hydrolysate solution also comprises a dyestuff compatible with said gelatin hydrolysate.

12. A process according to claim 6 wherein the gelatin hydrolysate is applied to said image layer as an aqueous solution containing from about 0.1 to about 10 percent by weight of gelatin.

13. A process according to claim 12 wherein said photoresist image is derived from a positive photoresist composition comprising a solvent solution comprising a novolak resin and a photosensitizer.

14. A process according to claim 13 wherein the image layer has been developed using an alkaline developer.

15. A process according to claim 6 wherein said thermally stabilizing material is spin-coated on said image layer in the form of an aqueous solution.

16. A process according to claim 6 wherein said post-development bake is carried out at a temperature within the range of about 100° C. to about 180° C.

* * * * *